United States Patent
Edwards et al.

(10) Patent No.: US 6,847,257 B2
(45) Date of Patent: Jan. 25, 2005

(54) EFFICIENT MINIMUM PULSE SPREAD SPECTRUM MODULATION FOR FILTERLESS CLASS D AMPLIFIERS

(75) Inventors: Christopher Francis Edwards, Sunnyvale, CA (US); Craig Alexander Easson, Sunnyvale, CA (US); Madhavprasad V. Kolluri, Sunnyvale, CA (US); Anthony Stephen Doy, Sunnyvale, CA (US)

(73) Assignee: Maxim Integrated Products, Inc., Sunnyvale, CA (US)

( * ) Notice: Subject to any disclaimer, the term of this patent is extended or adjusted under 35 U.S.C. 154(b) by 0 days.

(21) Appl. No.: 10/444,564

(22) Filed: May 23, 2003

(65) Prior Publication Data

US 2004/0232979 A1 Nov. 25, 2004

(51) Int. Cl.$^7$ .............. H03F 3/38; H03F 3/217
(52) U.S. Cl. .......................... 330/10; 330/251
(58) Field of Search ............... 330/10, 207 A, 330/251

(56) References Cited

U.S. PATENT DOCUMENTS

| | | | |
|---|---|---|---|
| 4,968,948 A | * | 11/1990 | Tokumo et al. ............ 330/10 |
| 5,077,539 A | | 12/1991 | Howatt |
| 5,767,740 A | * | 6/1998 | Fogg ........................... 330/10 |
| 6,211,728 B1 | | 4/2001 | Chen et al. |
| 6,614,297 B2 | * | 9/2003 | Score et al. ................. 330/10 |

* cited by examiner

Primary Examiner—Khanh V. Nguyen
(74) Attorney, Agent, or Firm—Blakely, Sokoloff, Taylor & Zafman LLP

(57) ABSTRACT

Method and apparatus to enable the use of class D amplifiers without the need for an output filter, while maintaining both a high efficiency and a high audio fidelity. Using the classic differential Pulse Width Modulation scheme, the high frequency carrier is first suppressed to achieve a ternary modulation, and then re-introduced as a common mode pulse whose width is modulated to provide the necessary output voltage, but whose width never decreases below a well-defined threshold. The frequency of the modulator waveform (ramp or triangle) may itself be modulated on a sample-by-sample basis, so that the EMI spectrum of the output waveforms can be made white at high frequencies. The combination of the modulation scheme and spread spectrum high frequency behavior allows the user to eliminate the external filter. Various embodiments are disclosed.

44 Claims, 6 Drawing Sheets

EFFICIENT MINIMUM PULSE SPREAD SPECTRUM MODULATION FOR FILTERLESS CLASS D AMPLIFIERS

BACKGROUND OF THE INVENTION

1. Field of the Invention

The present invention relates to the field of class D amplifiers.

2. Prior Art

Class D (audio) amplifiers for delivering between 10 mW and 10 W of power are generally avoided in high volume consumer applications because of the need for a bulky external filter to remove high frequency ripple and maximize efficiency. This passive filter will consist of at least 2 high current inductors and can easily double the cost and quadruple the printed circuit board space required to implement the class D amplifier compared with an equivalent linear class A or class AB design.

Disclosed in U.S. Pat. No. 5,077,539 is a switching amplifier system which in one embodiment includes switching circuitry responsive to a tri-state command signal for providing a power output from a power supply which has amplitude levels, time durations, and polarities corresponding to the tri-state command signal for supply to a load via a suitable filter. A further embodiment includes a linear amplifier, the switching circuitry responding to a fourth state command signal for actuating the linear amplifier to respond directly to an input signal when the amplitude of the input signal is below a selected level.

Disclosed in U.S. Pat. No. 6,211,728 is a Class-D switching amplifier having a ternary modulation scheme implemented in an H-bridge configuration. The switching amplifier has four states of operation, and achieves increased efficiency and reduced cost by delivering current to the load only when needed, and once delivered, maintaining the current. The Class-D switching amplifier is said to eliminate the need for post amplifier filters.

DETAILED DESCRIPTION OF THE PREFERRED EMBODIMENTS

In the description to follow, exemplary embodiments of the present invention will be described to illustrate the novel features of the invention, as set forth in the appended claims. It is to be understood, however, that the description is for illustration only, and not for purposes of limitation of the invention in any way.

Figure 1:
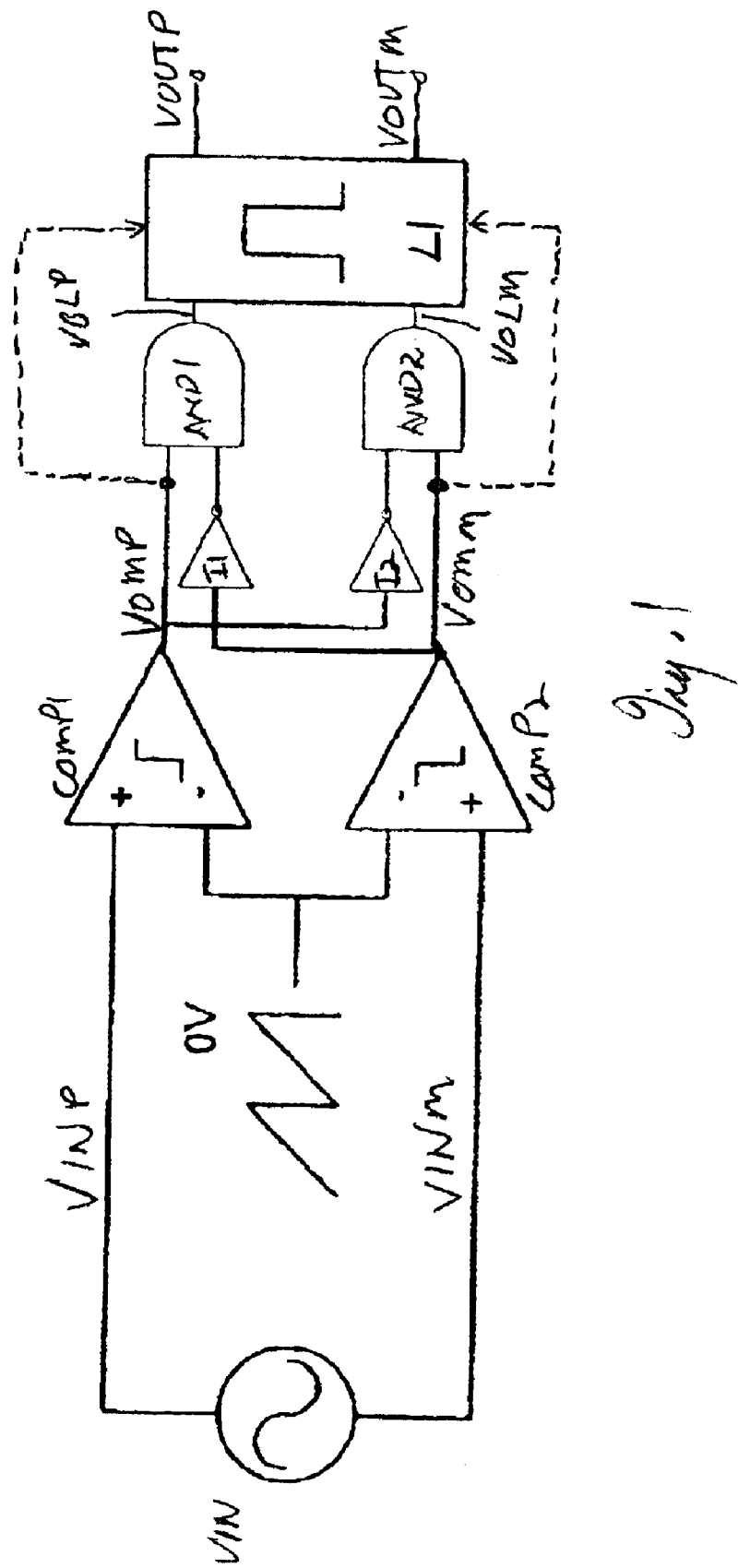
FIG. 1 is a diagram of one embodiment of the present invention for driving an H bridge in a class D amplifier.

Now referring to FIG. 1, a differential input signal VIN (VINP and VINM) to be amplified is provided, where VINM=−VINP and VIN=VINP−VINM=2VINP. The positive side input VINP is passed through a conventional pulse width modulator comprised of comparator COMP1 that compares the signal to a sawtooth or triangular waveform (details of the representative waveforms will be explained more fully later herein). The positive side input VINP causes an output of the modulator VOMP that is a square waveform with variable frequency and whose duty cycle is proportional to the instantaneous value of the input signal VINP. The negative side input signal VINM is passed through an identical pulse width modulator (comparator COMP2), generating a second square waveform VOMM. For zero signal (see FIG. 2), the waveforms VOMP and VOMM are in phase square waves with a 50% duty cycle. The common mode voltage is therefore also a square wave with a 50% duty cycle, while the differential voltage is zero.

Figure 2:
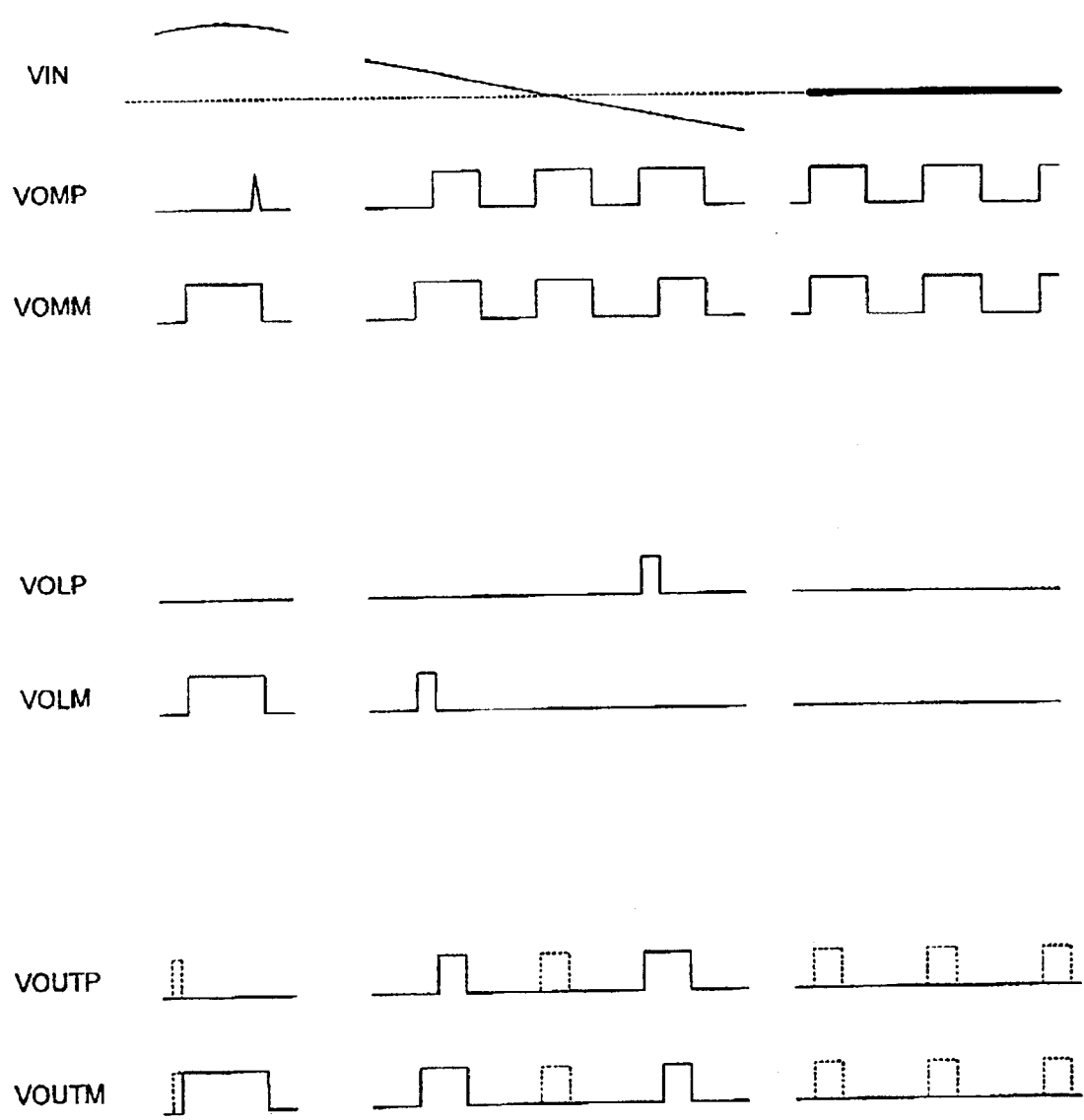
FIG. 2 presents diagrams illustrating various waveforms at various points in the diagram of FIG. 1 for various signal inputs.

The two waveforms then pass through a simple logic circuit (inverters I1 and I2 and AND gates AND1 and AND2) that makes the common mode voltage zero without changing the differential voltage. The outputs signals VOLP and VOLM of the logic circuit are also shown in FIG. 2. Note that both outputs cannot pulse at the same.

Subsequently, the outputs VOLP and VOLM of the logic circuit pass through a further logic circuit L1 that determines if a pulse is present on either VOLP or VOLM and it is above a certain well-defined width in time. If not, then a pulse is added equally to both sides (both VOLP and VOLM), such that, for small input signals, the differential mode voltage is still zero, but the common mode voltage contains pulses of at least a minimum duration. Exemplary outputs VOUTP and VOUTM are also shown in FIG. 2.

There are various ways of adding a pulse to both the VOUTP and VOUTM outputs simultaneously if a pulse of a width below the predetermined minimum width is detected on either of the signals VOLP or VOLM. By way of example, a pulse of a predetermined width could be added to both the VOUTP and VOUTM signals. In this case, the short pulse triggering the addition of the pulse of a predetermined minimum width would now have a width of the predetermined minimum width plus the shorter triggering pulse, while the other pulse would simply have the predetermined minimum width.

In a preferred embodiment, the pulse width triggering the addition of a pulse to both of the VOUTP and VOUTM outputs can be represented as a pulse width in time of less than $\Delta t$. The leading edge of each VOLP and VOLM pulse is detected, and then the trailing edge is detected. When the trailing edge follows the leading edge by less than $\Delta t$, the pulse is extended and a pulse is initiated on the other side. Both pulses are then terminated at a time $2\Delta t$ after the leading edge of the triggering pulse was detected. Thus in this implementation, the triggering pulse is extended to a width of $2\Delta t$, and a simultaneous pulse of a duration of not less than $\Delta t$ or more than $2\Delta t$ is added to the other side during that extension.

In the preferred embodiment, the case where VOLP and VOLM are both exactly zero leads to VOUTP and VOUTM equal to zero. However, this case is only rarely of practical significance, because small offsets and delays in the real system tend to cause the outputs to maintain some switching activity from sample to sample, particularly where the modulation scheme is used within a feedback circuit with a filter, as is common in class D amplifiers. Furthermore, in this embodiment, it should be noted that the additional pulse is only present for small input signals. For input signals above the well-defined threshold at which the logic circuit L1 determines that no additional pulse is required, switching activity on either VOUTP or VOUTM ceases. This has the benefit of reducing electromagnetic interference (EMI) emissions and maintaining maximum possible input signal range.

In another embodiment, the additional pulse is triggered by one of the comparator outputs VOMP or VOMM (which, in this embodiment, are fed directly to L1, as indicated by the dashed arrows in FIG. 1). Referring to FIG. 2, consider first the case where the rising edge of VOMM occurs before the rising edge of VOMP. In this case, the rising edge of VOMM triggers the respective output VOUTM to go high. The subsequent rising edge of VOMP then triggers the rising edge of the additional pulse on the respective VOUTP. When the additional pulse is terminated after a well-defined delay of width Δt, both VOUTP and VOUTM fall simultaneously. With a similar argument, in the case where the rising edge of VOMP occurs before the rising edge of VOMM, now VOMM triggers the rising edge of the additional pulse on the respective VOUTM.

In the case where the rising edges of VOMP and VOMM occur exactly simultaneously, as is the ideal case for zero input signal, an additional pulse of width Δt appears identically on both VOUTP and VOUTM as indicated in FIG. 2 (dashed pulses). In the case where the falling edge of the additional pulse would occur after the common falling edge of both VOMP and VOMM, the common falling edge of VOMP and VOMM overrides the additional pulse, such that the additional pulse is cut short by the common falling edge. For large signal amplitudes, this has the effect of reducing the width of the additional pulse linearly as the input signal increases toward full scale (defined as the point at which the duty cycle on either output reaches 100%). The point at which the additional pulse begins to decrease in width is approximately determined by the duty cycle of the additional pulse. For example, if the additional pulse has a duty cycle of 10%, then the additional pulse will begin reducing in width when the input signal reaches approximately 10% below full scale. This is a very acceptable compromise to removing the additional pulse completely, since typically class D amplifiers distort due to other considerations at close to full scale input signal, hence the narrower additional pulses at this point become of little or no practical significance.

This embodiment differs from the preferred embodiment in two respects. Firstly, the case where VOLP and VOLM are both exactly zero now results in an additional pulse on both outputs rather than zero on both outputs. This situation can be preferable compared with the previous embodiment, whose outputs will both be zero at sampling instances where VOLP and VOLM are exactly zero or have incomplete pulses below a threshold required to activate the sensing circuit in L1. By way of example, if the class D amplifier incorporates a feedback circuit whose feedback path has a finite common mode rejection, the intermittent zeros on both outputs can lead to smearing of the common mode signal in the frequency domain that could appear as noise in the differential signal path. This second embodiment prevents this behavior. The second difference is that, at all input signals up to full scale, both outputs maintain switching activity (at a minimum switching pulse width each pulse width modulator cycle). Again, this situation may be preferred over the previous embodiment, where a transition in the common mode behavior occurs when the input signal reaches the amplitude where the additional pulse no longer appears on one of the outputs. This transitional behavior, although ideally rejected by the differential system, may cause noise and distortion to occur due to the finite common mode rejection of the circuit.

These implementations are exemplary only however, as other implementations may be used as desired.

Figure 3A:
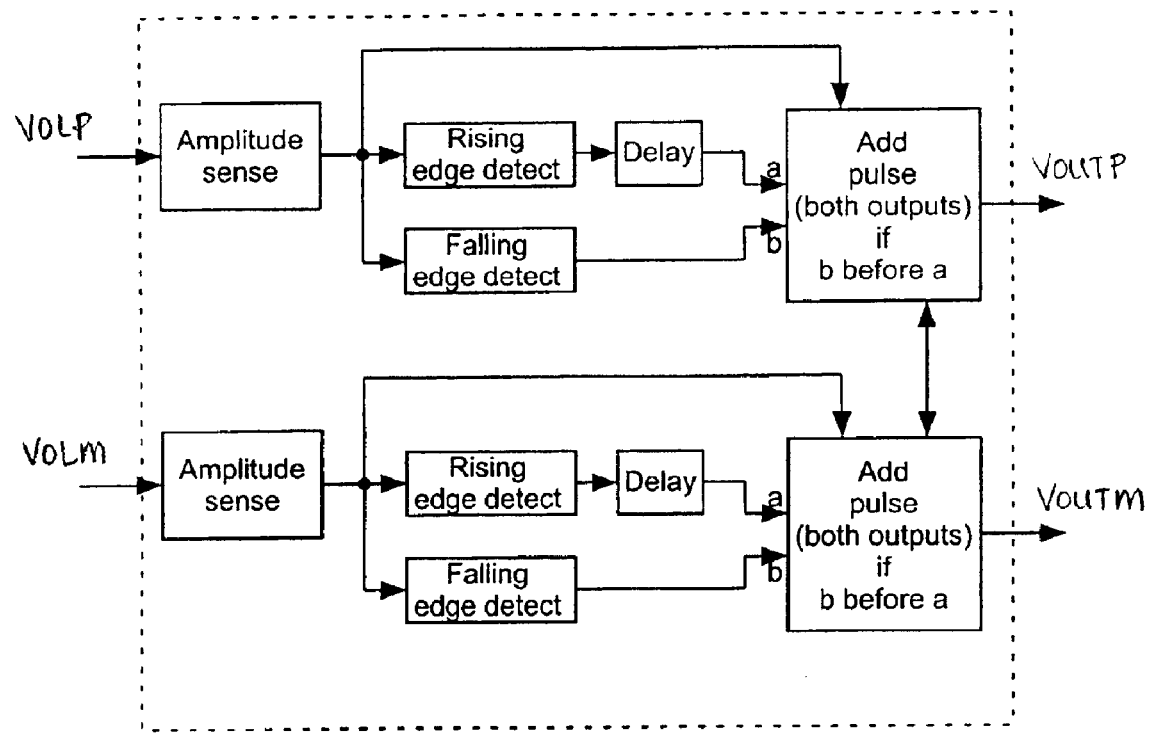
FIGS. 3a and 3b are diagrams illustrating the logical signal flow in an exemplary logic circuit L1 of FIG. 1.

A block diagram for an exemplary logic circuit L1 may be seen in FIG. 3a. This diagram illustrates the general logic of the logic circuit, as opposed to a detailed circuit diagram for the circuit, as the details of any circuit implementation may vary and are not important to the present invention. As may be seen in the Figure, the outputs VOLP and VOLM of AND gates AND1 and AND2, respectively, are each applied to a respective amplitude sense circuit which simply ignores pulses below a predetermined height, or below a predetermined fraction of the height of a full height pulse. In that regard, it should be recognized that the circuitry hereinbefore described which results in the signals VOLP and VOLM is signal processing circuitry, not power switching circuitry, so as to be capable of very high speed operation in comparison to the power switching circuitry of an H bridge, such as the exemplary H bridge of FIG. 4. Consequently, a pulse in the VOLP signal or the VOLM signal which is not a full height pulse is caused by the pulse width being so short in time duration that the trailing edge of the pulse intersects the leading edge of the pulse before full pulse height is reached. This, then, represents such a short pulse as to not be significant in the operation of the amplifier, and accordingly is ignored by the amplitude sense.

Figure 3B:
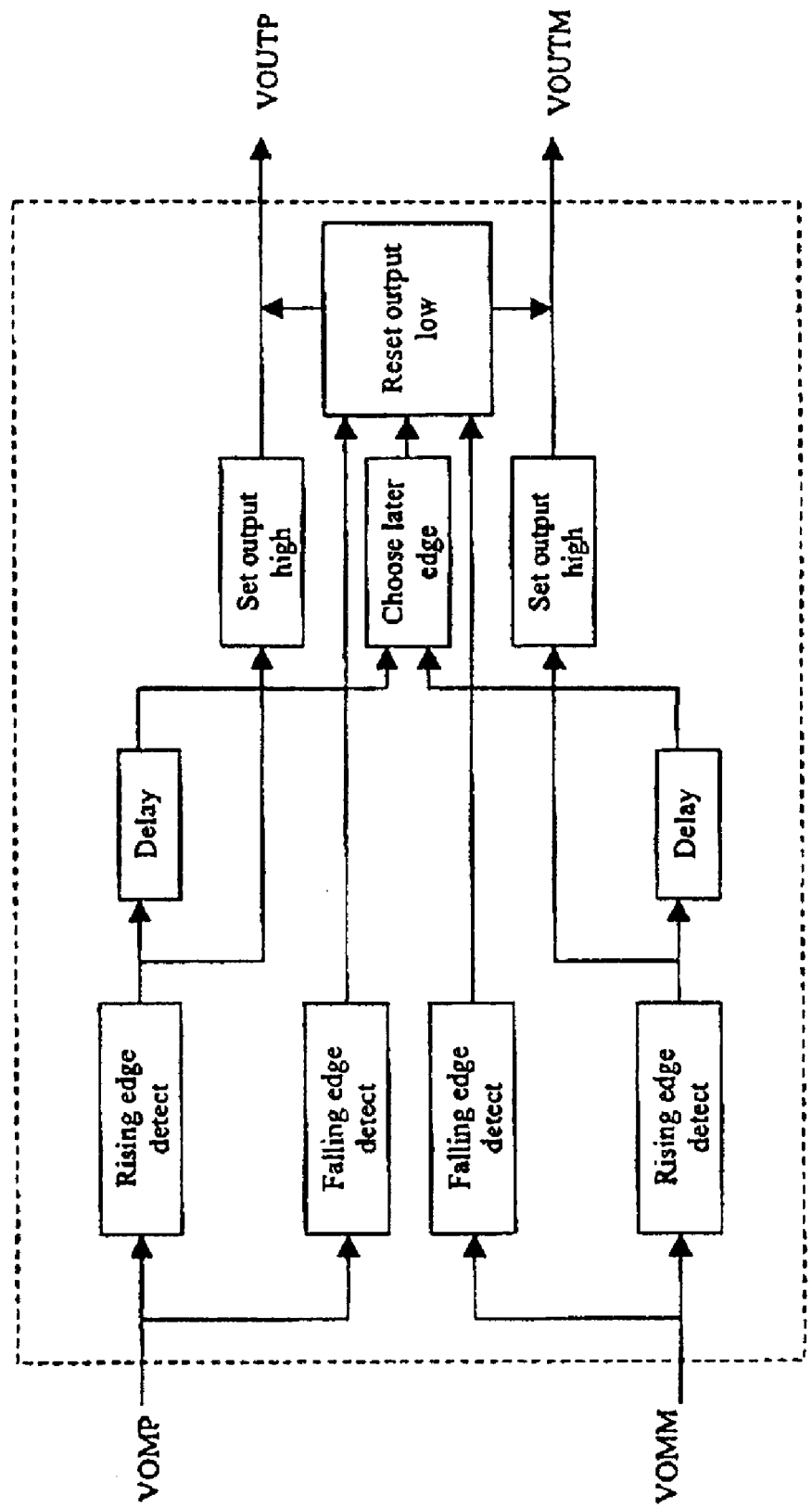

A pulse of adequate height is passed to the respective rising edge detect circuit and a falling edge detect circuit, the outputs of which, after delay of the rising edge detect circuit output, are provided as the respective signals a and b. The delay imposed on the rising edge of the pulse is in accordance with the minimum pulse width to be allowed. If the pulse VOLP or VOLM (both will not occur at the same time) is of adequate width, the pulse is then passed to the respective output VOUTP or VOUTM. If, on the other hand, the pulse is below the minimum pulse width, then an appropriate simultaneous pulse is added to both output pulses VOUTP and VOUTM, the added pulse as an extension of one of the output pulses VOUTP or VOUTM and as an original pulse to the other. The width of the pulse added may be the same as or different from the minimum pulse width below which the pulse will be added, or may be of the width needed to extend the short pulse to some predetermined pulse width above the minimum pulse width triggering the addition of the pulse, such as twice or more the minimum pulse width. A block diagram for a second exemplary logic circuit L1 may be seen in FIG. 3b. In this case, the comparator outputs VOMP and VOMM are applied to the respective rising edge detector circuits, whose outputs are used to set VOUTP and VOUTM high respectively. Each rising edge detector output is then delayed, and then both of the delayed rising edges are taken and the latter of the two is selected. This latter edge is then used to reset both outputs VOUTP and VOUTM. Additional edge detectors are used to detect the common falling edge of the VOMP and VOMM, and the output of these edge detectors are also used to reset the outputs VOUTP and VOUTM. In this way, the reset edge of the outputs VOUTP and VOUTM is overridden by the reset edge of the comparator outputs VOMP and VOMM. This must be done to maintain overall synchronization of the system with the sawtooth oscillator.

As shall subsequently be seen, because all additional pulses are added in the common mode, they do not affect the differential signal provided to the H-bridge. They do, however, assure that the much slower switching transistors in the H-bridge are never partially turned on and then turned off, giving rise to the non-linearity described in one of the prior art patents herein before referred to. Instead, the adding of the pulse to both the VOLP and VOLM signals, when necessary, assures linearity in the differential signal applied to the H-bridge, and accordingly linearity in the output thereof.

The pulse, when added to both the VOUTP and VOUTM pulses, could be added at the beginning of a short pulse, though it is believed that it is a simpler implementation to add the pulse when a short pulse is ending.

Figure 4:
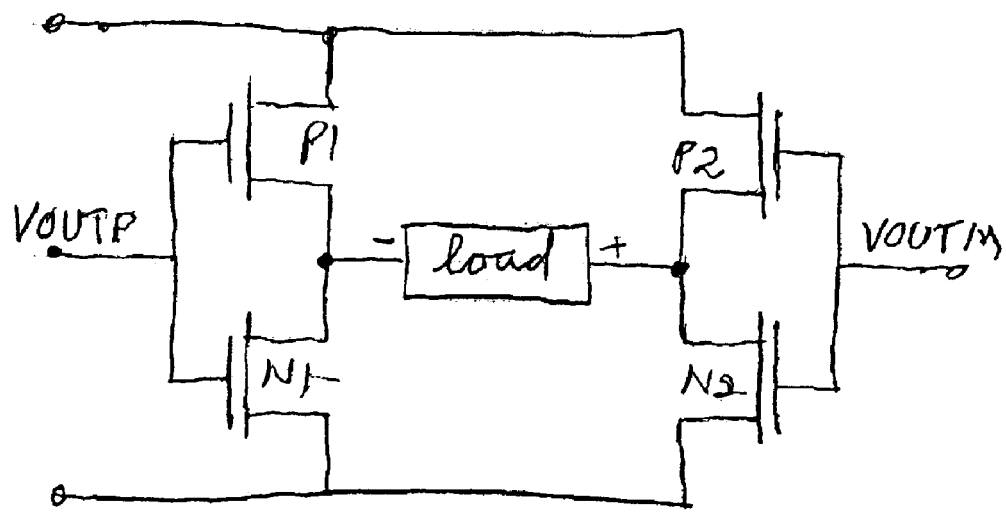
FIG. 4 shows a typical H bridge as can be driven by the circuit of FIG. 1.

The final outputs VOUTP and VOUTM of the logic circuit L1 are used to drive an H bridge coupled to a load on the amplifier output, as shown in FIG. 4. Although the H-bridge illustrated in FIG. 4 is comprised of two n-channel switching transistors N1 and N2 and two p-channel transistors P1 and P2, it should be noted that the present invention is not limited to use with this specific H-bridge implementation. By way of example, a popular alternative H-bridge implementation would incorporate two n-channel transistors in place of the two p-channel transistors and whose control terminals are driven by some means to a voltage sufficiently above the power supply voltage to turn on the devices, and then to a ground or negative power supply voltage to turn them off, this control voltage being provided in the correct sense to ensure that the H-bridge output switching behavior is the same as that of FIG. 4. The specific exemplary implementation shown in FIG. 4 is described here for clarity. When both inputs VOUTP and VOUTM to the H-bridge shown in FIG. 4 are low, p-channel transistors P1 and P2 will both be on, shorting the load by the common connection of the sources of the two p-channel transistors. When both inputs VOUTP and VOUTM to the H-bridge are high, the two p-channel transistors P1 and P2 will be turned off and the two n-channel transistors N1 and N2 will be turned on, shorting the load through the common connection of the sources of the n-channel transistors. Thus the common mode output to the H-bridge results in the shorting of the load, regardless of whether the two inputs to the H-bridge are both high or both low. Consequently, the addition of any minimum pulse to both signals VOUTP and VOUTM does not change the effective connection of the load, that is a shorted connection, though does change which two transistors are turned on to cause that short.

In the case of a differential signal wherein VOUTP is high during some period when VOUTM is low, n-channel transistor N1 and p-channel transistor P2 will be turned on, with the other two transistors turned off. This connects the positive side of the load to the positive power supply and the negative side of the load to the negative power supply. Similarly, if the signal VOUTP is low and the signal VOUTM is high, p-channel transistor P1 and n-channel transistor N2 will be turned on, with the other two transistors turned off, thereby connecting the negative side of the load to the positive power supply terminal and the positive side of the load to the negative power supply terminal. The net effect is a ternary state operation of the H-bridge, namely connection of the load to the power supply with the positive sense on the occurrence of a positive differential input, connection of the load to the power supply in a negative sense on the occurrence of a negative differential input, and shorting the load during periods of zero differential input, regardless of the instantaneous common mode voltage.

Thus, in operation of the preferred embodiment, partial pulses in the signal processing circuitry are ignored. Also, pulses in the VOLP and VOLM signals (FIGS. 1, 2 and 3) which are of sufficient duration to assure full turn-on of the appropriate pair of switching transistors driving the load before turn-off is initiated (preferably with at least some minimum on time) will be passed directly to the H-bridge without modification. However, full height pulses in the VOLP and VOLM signals which are too short in duration for the full switching of the transistors in the H-bridge will result in the adding of the pulse on both signals VOUTP and VOUTM to drive the H-bridge to assure full switching.

Figure 5:
FIGS. 5 through 9 illustrate various waveforms that may be used in the pulse width modulators.
Figure 6:

The modulation scheme of the present invention may be practiced using a ramp or a triangular waveform in the pulse width modulators, as shown in FIGS. 5 and 6, respectively. However, another aspect of the present invention that may be practiced with the foregoing modulation scheme or with other modulation schemes is to use a pulse width modulator waveform that is not of a constant frequency or repetition rate.

In particular, the object of the present invention, as with the prior art, is to provide a class D amplifier that will keep electromagnetic interference emissions below regulatory requirements without using an output filter. A ramp or triangular wave of a fixed frequency provides an amplifier output signal that has a significant frequency component at that frequency and harmonics thereof. However, by proper variation of the modulator frequency, the noise may instead be spread over a frequency range, a sort of spread spectrum operation. For instance, a random or pseudo random modulator frequency will produce rather flat or white noise of low amplitude at any one frequency in the amplifier output, rather than noise fairly concentrated at specific frequencies.

Figure 7:
Figure 8:
Figure 9:

The variable modulator frequency may be provided in a ramp or sawtooth waveform, or a triangular waveform, as desired, as shown in FIGS. 7 and 8. In the case of a triangular wave form, the variation may be made one triangular wave to the next, as in FIG. 8, or between each ramp making up the triangular waveform, as shown in FIG. 9.

Figure 10:
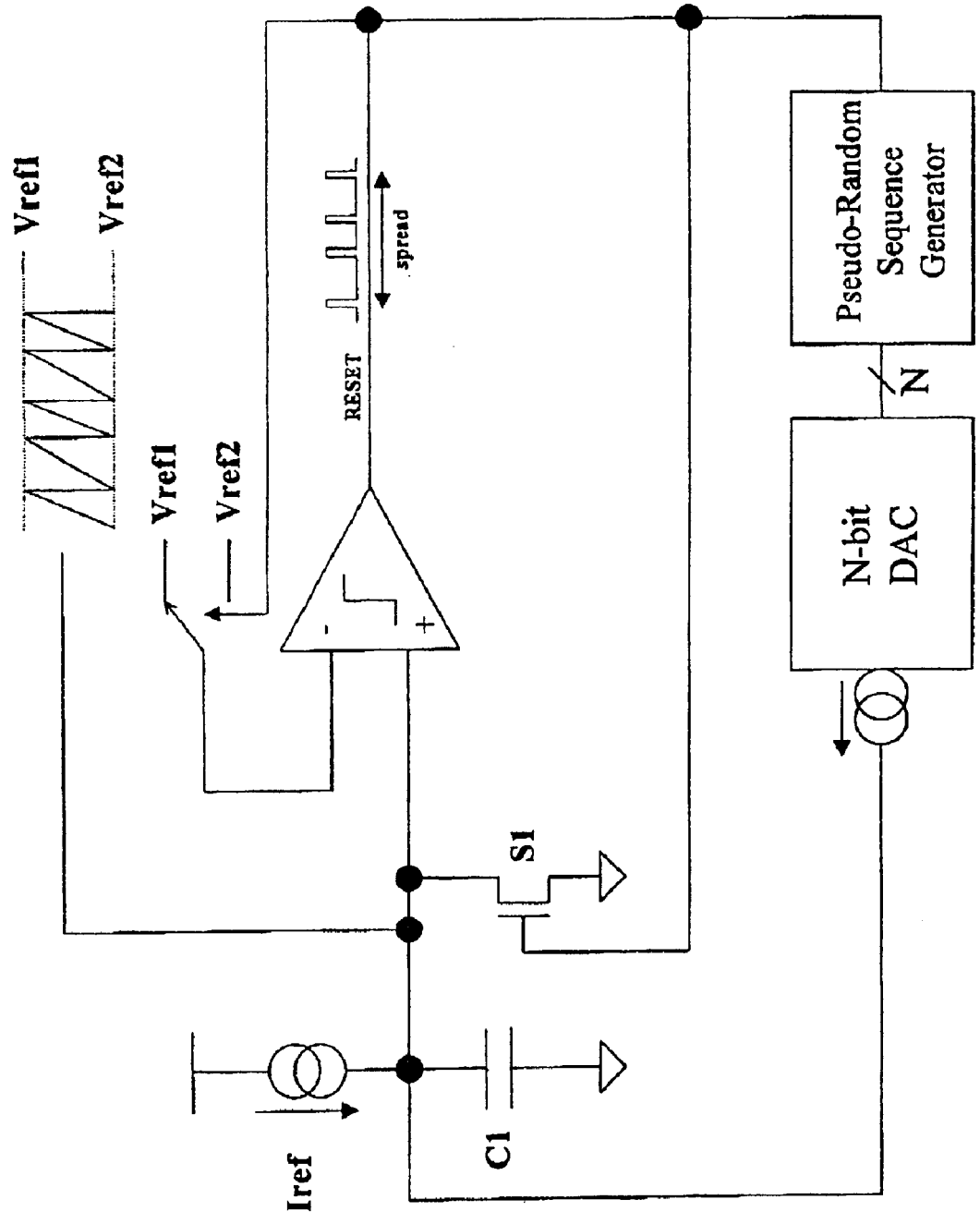
FIG. 10 is a diagram of one circuit for generating a sawtooth or triangular waveform with a variable frequency.

There are many possible methods of generating a sawtooth or triangular waveform with a variable frequency. A preferred embodiment is shown in FIG. 10. In this embodiment, a current source is used to charge a capacitor. When the voltage on the capacitor reaches a first fixed threshold voltage, the capacitor voltage is rapidly discharged with a switch. When the capacitor voltage reaches a second fixed threshold voltage that is lower than the first, the switch is turned off and the capacitor begins charging again. Hence, the voltage waveform on the capacitor has a sawtooth shape and ramps between the two threshold voltage values. In this implementation, the control voltage for the switch is a digital pulse of short duration. This control pulse is used as a clock pulse to update the outputs of a digital pseudo-random sequence generator, whose digital outputs are then converted to a current using a simple current-switching digital-to-analog converter circuit, and whose current output is used to add or subtract current from the current source that is used to charge the capacitor. In this way, a sawtooth is generated whose ramp rate changes on a sample-by-sample basis, but whose ramp remains substantially linear from sample to sample.

This modulation scheme overcomes the linearity limitations caused by switching pulses that are too short to fully turn on the power devices before initiating turnoff of the devices, while also providing reduced ripple at small output signals. By virtue of the variable frequency of the input waveform, the placement in time of the edges of the minimum pulse is such that the high frequency spectrum of the output voltage is substantially flat (white) compared with the prior art modulation schemes, and hence electromagnetic interference emissions from the circuit can be kept substantially below regulatory requirements without the need for using an external filter between the output pins of the chip and the load.

The frequency range of the random or pseudo random variation in the pulse width modulators effects the spreading of the noise. Consequently, the wider that frequency range, the lower the peak amplitudes of noise at frequencies of concern for EMI limitations. However, a wider frequency range increases the components of noise that fall into the audio frequency range. Accordingly, there is a tradeoff that must be made. In one embodiment, a modulator center frequency of 1 MHz is used, with a pseudo random frequency variation of ±10%.

While certain preferred embodiments of the present invention have been disclosed herein, such disclosure is only for purposes of understanding the exemplary embodiments and not by way of limitation of the invention. It will be obvious to those skilled in the art that various changes in form and detail may be made in the invention without departing from the spirit and scope of the invention as set out in the full scope of the following claims.

What is claimed is:

1. A method of class D amplification comprising:
   (a) pulse width modulating each side of a differential input signal;
   (b) converting the pulse width modulated signals to a pair of control signals that could;
      (i) control H bridge switches coupled to a load to couple the load to a source of power with a first polarity;
      (ii) control the H bridge switches to couple the load to the source of power with a second polarity opposite the first plurality; or,
      (iii) control the H bridge switches to short the load;
   (c) adding a pulse in common mode to both control signals when a pulse is detected on either control signal that is below a first predetermined pulse width;
   (d) controlling the H bridge switches with the control signals as may be modified in (c).

2. The method of claim 1 wherein the first predetermined pulse width is a pulse width at least adequate to fully turn on the switches of the H bridge.

3. The method of claim 2 wherein the pulses added in common mode have a pulse width at least adequate to increase the pulse width on both of the control signals to the first predetermined pulse width.

4. The method of claim 1 wherein the added pulses have a second predetermined width.

5. The method of claim 4 wherein the second predetermined width is approximately twice the first predetermined width.

6. The method of claim 1 wherein the width of pulses added in common mode is reduced as the differential input signal approaches a full-scale value.

7. The method of claim 1 wherein switching activity is maintained on both of the control signals on each cycle of the pulse width modulator.

8. The method of claim 1 wherein the frequency of the pulse width modulating is varied.

9. The method of claim 1 wherein the frequency of the pulse width modulating is varied, cycle to cycle.

10. The method of claim 1 wherein the frequency of the pulse width modulating is varied, cycle to cycle on a pseudo random basis.

11. The method of claim 1 wherein the frequency of the pulse width modulating is varied, cycle to cycle on a pseudo random basis about a center frequency of approximately ±10%.

12. The method of claim 11 wherein the center frequency is approximately 1 MHz.

13. The method of claim 1 wherein the pulse width modulating comprises use of a sawtooth waveform having a varying ramp rate.

14. The method of claim 1 wherein the pulse width modulating comprises use of a triangular waveform having a varying triangular waveform period.

15. The method of claim 1 wherein the pulse width modulating comprises use of a triangular waveform, the sides of the triangular waveform having varying ramp rates.

16. A method of class D amplification comprising:
   (a) pulse width modulating an input signal;
   (b) converting the pulse width modulated signal to a differential signal having opposite differential states and a common mode state;
   (c) adding a pulse in common mode to both sides of the differential signal when a pulse is detected on either side of the differential signal that is below a first predetermined pulse width;
   (d) controlling H bridge switches coupled to a load with the signal of (c).

17. The method of claim 16 wherein the first predetermined pulse width is a pulse width at least adequate to fully turn on the switches of the H bridge.

18. The method of claim 17 wherein the pulses added in common mode have a pulse width at least adequate to increase the pulse width on both sides of the differential signal to the first predetermined pulse width.

19. The method of claim 16 wherein the added pulses have a second predetermined width.

20. The method of claim 19 wherein the second predetermined width is approximately twice the first predetermined width.

21. The method of claim 16 wherein the width of pulses added in common mode is reduced as the differential input signal approaches a full-scale value.

22. The method of claim 16 wherein switching activity is maintained in the H bridge on each cycle of the pulse width modulator.

23. The method of claim 16 wherein the frequency of the pulse width modulating is varied.

24. The method of claim 16 wherein the frequency of the pulse width modulating is varied, cycle to cycle.

25. The method of claim 16 wherein the frequency of the pulse width modulating is varied, cycle to cycle on a pseudo random basis.

26. The method of claim 16 wherein the frequency of the pulse width modulating is varied, cycle to cycle on a pseudo random basis about a center frequency of approximately ±10%.

27. The method of claim 26 wherein the center frequency is approximately 1 MHz.

28. The method of claim 16 wherein the pulse width modulating comprises use of a sawtooth waveform having a varying ramp rate.

29. The method of claim 16 wherein the pulse width modulating comprises use of a triangular waveform having a varying triangular waveform period.

30. The method of claim 16 wherein the pulse width modulating comprises use of a triangular waveform, the two sides of the triangular waveform having varying ramp rates.

31. In a class D amplifier having a pair of signals for controlling an H bridge driving a load, a method of increasing the linearity for small signals comprising:

(a) monitoring the signals for controlling the H bridge;

(b) if a pulse of less than a first predetermined width is detected in either of the pair of signals, adding a pulse of a second predetermined width to each of the pair of signals; and, (c) controlling the H bridge with the pair of signals as may be altered in (b) above.

32. The method of claim 31 wherein the first predetermined pulse width is a pulse width at least adequate to fully turn on switches in the H bridge.

33. The method of claim 32 wherein the pulses added in b) have a pulse width at least adequate to increase the pulse width on both of the signals to the first predetermined pulse width.

34. The method of claim 31 wherein the second predetermined width is approximately twice the first predetermined width.

35. The method of claim 31 wherein the width of pulses added in b) is reduced as an input signal approaches a full-scale value.

36. In a class D amplifier having a pulse width modulator an providing a pair of signals for controlling an H bridge driving a load, a method of increasing the linearity for small signals comprising:

(a) monitoring the signals for controlling the H bridge;

(b) if a pulse of less than a first predetermined width is detected in either of the pair of signals, adding a pulse of a second predetermined width to each of the pair of signals;

(c) controlling the H bridge with the pair of signals as may be altered in b) above; and, (d) maintaining switching activity on both of the signals on each cycle of the pulse width modulator.

37. The method of claim 36 wherein a frequency of operation of the pulse width modulator is varied.

38. The method of claim 36 wherein a frequency of operation of the pulse width modulator is varied, cycle to cycle.

39. The method of claim 36 wherein a frequency of operation of the pulse width modulating is varied, cycle to cycle on a pseudo random basis.

40. The method of claim 36 wherein the frequency of operation of the pulse width modulator is varied, cycle to cycle on a pseudo random basis about a center frequency of approximately ±10%.

41. The method of claim 40 wherein the center frequency is approximately 1 MHz.

42. The method of claim 36 wherein the pulse width modulator uses a sawtooth waveform having a varying ramp rate.

43. The method of claim 36 wherein the pulse width modulator uses a triangular waveform having a varying triangular waveform period.

44. The method of claim 36 wherein the pulse width modulator uses a triangular waveform, the sides of the triangular waveform having varying ramp rates.

* * * * *